(12) United States Patent
Coleman et al.

(10) Patent No.: US 9,244,100 B2
(45) Date of Patent: Jan. 26, 2016

(54) CURRENT CLAMP WITH JAW CLOSURE DETECTION

(71) Applicant: Midtronics, Inc., Willowbrook, IL (US)

(72) Inventors: Ryan C. Coleman, Channahon, IL (US); Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 155 days.

(21) Appl. No.: 14/204,286

(22) Filed: Mar. 11, 2014

(65) Prior Publication Data
US 2014/0266225 A1  Sep. 18, 2014

Related U.S. Application Data

(60) Provisional application No. 61/789,189, filed on Mar. 15, 2013.

(51) Int. Cl.
*G01N 27/416* (2006.01)
*G01R 1/22* (2006.01)
*G01R 31/36* (2006.01)

(52) U.S. Cl.
CPC .............. *G01R 1/22* (2013.01); *G01R 31/3627* (2013.01)

(58) Field of Classification Search
CPC ............................ G01R 1/22; G01R 31/3627
USPC ......................................................... 324/426
See application file for complete search history.

(56) References Cited

U.S. PATENT DOCUMENTS

| 85,553 A | 1/1869 | Adams | 33/472 |
|---|---|---|---|
| 2,000,665 A | 5/1935 | Neal | 439/440 |
| 2,417,940 A | 3/1947 | Lehman | 200/61.25 |
| 2,437,772 A | 3/1948 | Wall | 324/523 |
| 2,514,745 A | 7/1950 | Dalzell | 324/115 |
| 2,727,221 A | 12/1955 | Springg | 340/447 |
| 3,025,455 A | 3/1962 | Jonsson | 323/369 |
| 3,178,686 A | 4/1965 | Mills | 340/447 |
| 3,215,194 A | 11/1965 | Sununu et al. | 165/80.3 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |

(Continued)

FOREIGN PATENT DOCUMENTS

| CN | 2470964 Y | 1/2002 |
|---|---|---|
| CN | 201063352 Y | 5/2008 |

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner* — M'Baye Diao
(74) *Attorney, Agent, or Firm* — Westman, Champlin & Koehler, P.A.

(57) ABSTRACT

A current clamp has a pair of jaws that are placed around an electrical conductor to measure a parameter (a measurable quantity or distinguishing or notable characteristic) corresponding to the electrical conductor.

20 Claims, 12 Drawing Sheets

(56) References Cited

U.S. PATENT DOCUMENTS

| | | | | |
|---|---|---|---|---|
| 3,699,433 | A | 10/1972 | Smith, Jr. | 324/523 |
| 3,729,989 | A | 5/1973 | Little | 73/862.192 |
| 3,750,011 | A | 7/1973 | Kreps | 324/430 |
| 3,753,094 | A | 8/1973 | Furuishi et al. | 324/430 |
| 3,776,177 | A | 12/1973 | Bryant et al. | 116/311 |
| 3,796,124 | A | 3/1974 | Crosa | 411/521 |
| 3,808,522 | A | 4/1974 | Sharaf | 324/430 |
| 3,811,089 | A | 5/1974 | Strezelewicz | 324/170 |
| 3,816,805 | A | 6/1974 | Terry | 320/123 |
| 3,850,490 | A | 11/1974 | Zehr | 439/822 |
| 3,857,082 | A | 12/1974 | van Opijnen | 320/143 |
| 3,873,911 | A | 3/1975 | Champlin | 324/430 |
| 3,876,931 | A | 4/1975 | Godshalk | 324/429 |
| 3,886,426 | A | 5/1975 | Daggett | 320/117 |
| 3,886,443 | A | 5/1975 | Miyakawa et al. | 324/426 |
| 3,889,248 | A | 6/1975 | Ritter | 340/636.11 |
| 3,906,329 | A | 9/1975 | Bader | 320/134 |
| 3,909,708 | A | 9/1975 | Champlin | 324/431 |
| 3,920,284 | A | 11/1975 | Lane et al. | 303/122.06 |
| 3,936,744 | A | 2/1976 | Perlmutter | 324/772 |
| 3,946,299 | A | 3/1976 | Christianson et al. | 320/430 |
| 3,947,757 | A | 3/1976 | Grube et al. | 324/416 |
| 3,969,667 | A | 7/1976 | McWilliams | 324/427 |
| 3,979,664 | A | 9/1976 | Harris | 324/397 |
| 3,984,762 | A | 10/1976 | Dowgiallo, Jr. | 324/430 |
| 3,984,768 | A | 10/1976 | Staples | 324/712 |
| 3,989,544 | A | 11/1976 | Santo | 429/65 |
| 3,997,830 | A | 12/1976 | Newell et al. | 320/102 |
| 4,008,619 | A | 2/1977 | Alcaide et al. | 73/724 |
| 4,023,882 | A | 5/1977 | Pettersson | 439/426 |
| 4,024,953 | A | 5/1977 | Nailor, III | 206/344 |
| 4,047,091 | A | 9/1977 | Hutchines et al. | 363/59 |
| 4,053,824 | A | 10/1977 | Dupuis et al. | 324/434 |
| 4,056,764 | A | 11/1977 | Endo et al. | 320/101 |
| 4,057,313 | A | 11/1977 | Polizzano | 439/219 |
| 4,070,624 | A | 1/1978 | Taylor | 324/772 |
| 4,086,531 | A | 4/1978 | Bernier | 324/772 |
| 4,106,025 | A | 8/1978 | Katz | 343/715 |
| 4,112,351 | A | 9/1978 | Back et al. | 324/380 |
| 4,114,083 | A | 9/1978 | Benham et al. | 340/636.13 |
| 4,126,874 | A | 11/1978 | Suzuki et al. | 396/301 |
| 4,160,916 | A | 7/1979 | Papasideris | 307/10.6 |
| 4,178,546 | A | 12/1979 | Hulls et al. | 324/772 |
| 4,193,025 | A | 3/1980 | Frailing et al. | 324/427 |
| 4,207,610 | A | 6/1980 | Gordon | 701/33.9 |
| 4,207,611 | A | 6/1980 | Gordon | 701/33 |
| 4,217,645 | A | 8/1980 | Barry et al. | 702/63 |
| 4,218,745 | A | 8/1980 | Perkins | 324/66 |
| 4,280,457 | A | 7/1981 | Bloxham | 123/198 R |
| 4,297,639 | A | 10/1981 | Branham | 324/429 |
| 4,307,342 | A | 12/1981 | Peterson | 324/767 |
| 4,315,204 | A | 2/1982 | Sievers et al. | 322/28 |
| 4,316,185 | A | 2/1982 | Watrous et al. | 340/636.11 |
| 4,322,685 | A | 3/1982 | Frailing et al. | 324/429 |
| 4,351,405 | A | 9/1982 | Fields et al. | 180/65.2 |
| 4,352,067 | A | 9/1982 | Ottone | 324/434 |
| 4,360,780 | A | 11/1982 | Skutch, Jr. | 324/437 |
| 4,361,809 | A | 11/1982 | Bil et al. | 324/426 |
| 4,363,407 | A | 12/1982 | Buckler et al. | 209/3.3 |
| 4,369,407 | A | 1/1983 | Korbell | 324/416 |
| 4,379,989 | A | 4/1983 | Kurz et al. | 320/165 |
| 4,379,990 | A | 4/1983 | Sievers et al. | 322/99 |
| 4,385,269 | A | 5/1983 | Aspinwall et al. | 320/129 |
| 4,390,828 | A | 6/1983 | Converse et al. | 320/153 |
| 4,392,101 | A | 7/1983 | Saar et al. | 320/156 |
| 4,396,880 | A | 8/1983 | Windebank | 320/156 |
| 4,408,157 | A | 10/1983 | Beaubien | 324/712 |
| 4,412,169 | A | 10/1983 | Dell'Orto | 320/123 |
| 4,423,378 | A | 12/1983 | Marino et al. | 324/427 |
| 4,423,379 | A | 12/1983 | Jacobs et al. | 324/429 |
| 4,424,491 | A | 1/1984 | Bobbett et al. | 324/433 |
| 4,425,791 | A | 1/1984 | Kling | 73/116.02 |
| 4,441,359 | A | 4/1984 | Ezoe | 73/116.06 |
| 4,459,548 | A | 7/1984 | Lentz et al. | 324/472 |
| 4,514,694 | A | 4/1985 | Finger | 324/429 |
| 4,520,353 | A | 5/1985 | McAuliffe | 340/636.16 |
| 4,521,498 | A | 6/1985 | Juergens | 429/59 |
| 4,564,798 | A | 1/1986 | Young | 320/103 |
| 4,620,767 | A | 11/1986 | Woolf | 439/217 |
| 4,633,418 | A | 12/1986 | Bishop | 702/63 |
| 4,637,359 | A | 1/1987 | Cook | 123/179 |
| 4,659,977 | A | 4/1987 | Kissel et al. | 320/150 |
| 4,663,580 | A | 5/1987 | Wortman | 320/153 |
| 4,665,370 | A | 5/1987 | Holland | 324/429 |
| 4,667,143 | A | 5/1987 | Cooper et al. | 320/153 |
| 4,667,279 | A | 5/1987 | Maier | 363/46 |
| 4,678,998 | A | 7/1987 | Muramatsu | 324/427 |
| 4,679,000 | A | 7/1987 | Clark | 324/428 |
| 4,680,528 | A | 7/1987 | Mikami et al. | 320/165 |
| 4,686,442 | A | 8/1987 | Radomski | 320/123 |
| 4,697,134 | A | 9/1987 | Burkum et al. | 320/134 |
| 4,707,795 | A | 11/1987 | Alber et al. | 702/63 |
| 4,709,202 | A | 11/1987 | Koenck et al. | 320/112 |
| 4,710,861 | A | 12/1987 | Kanner | 363/46 |
| 4,719,428 | A | 1/1988 | Liebermann | 324/436 |
| 4,723,656 | A | 2/1988 | Kiernan et al. | 206/705 |
| 4,743,855 | A | 5/1988 | Randin et al. | 324/430 |
| 4,745,349 | A | 5/1988 | Palanisamy et al. | 320/125 |
| 4,773,011 | A | 9/1988 | VanHoose | 701/30 |
| 4,781,629 | A | 11/1988 | Mize | 439/822 |
| D299,909 | S | 2/1989 | Casey | D10/77 |
| 4,816,768 | A | 3/1989 | Champlin | 324/428 |
| 4,820,966 | A | 4/1989 | Fridman | 320/116 |
| 4,825,170 | A | 4/1989 | Champlin | 324/436 |
| 4,847,547 | A | 7/1989 | Eng, Jr. et al. | 320/153 |
| 4,849,700 | A | 7/1989 | Morioka et al. | 324/427 |
| 4,874,679 | A | 10/1989 | Miyagawa | 429/91 |
| 4,876,495 | A | 10/1989 | Palanisamy et al. | 320/106 |
| 4,881,038 | A | 11/1989 | Champlin | 324/436 |
| 4,885,523 | A | 12/1989 | Koench | 230/131 |
| 4,888,716 | A | 12/1989 | Ueno | 702/63 |
| 4,901,007 | A | 2/1990 | Sworm | 324/110 |
| 4,907,176 | A | 3/1990 | Bahnick et al. | 364/551.01 |
| 4,912,416 | A | 3/1990 | Champlin | 324/430 |
| 4,913,116 | A | 4/1990 | Katogi et al. | 123/406.32 |
| 4,926,330 | A | 5/1990 | Abe et al. | 701/33 |
| 4,929,931 | A | 5/1990 | McCuen | 340/636.15 |
| 4,931,738 | A | 6/1990 | MacIntyre et al. | 324/435 |
| 4,932,905 | A | 6/1990 | Richards | 439/822 |
| 4,933,845 | A | 6/1990 | Hayes | 710/104 |
| 4,934,957 | A | 6/1990 | Bellusci | 439/504 |
| 4,937,528 | A | 6/1990 | Palanisamy | 324/430 |
| 4,947,124 | A | 8/1990 | Hauser | 324/430 |
| 4,949,046 | A | 8/1990 | Seyfang | 324/427 |
| 4,956,597 | A | 9/1990 | Heavey et al. | 320/129 |
| 4,965,738 | A | 10/1990 | Bauer et al. | 320/136 |
| 4,968,941 | A | 11/1990 | Rogers | 324/428 |
| 4,968,942 | A | 11/1990 | Palanisamy | 324/430 |
| 4,969,834 | A | 11/1990 | Johnson | 439/141 |
| 4,983,086 | A | 1/1991 | Hatrock | 411/259 |
| 5,004,979 | A | 4/1991 | Marino et al. | 324/160 |
| 5,030,916 | A | 7/1991 | Bokitch | 324/503 |
| 5,032,825 | A | 7/1991 | Kuznicki | 340/636.15 |
| 5,034,893 | A | 7/1991 | Fisher | 701/99 |
| 5,037,778 | A | 8/1991 | Stark et al. | 228/121 |
| 5,047,722 | A | 9/1991 | Wurst et al. | 324/430 |
| 5,081,565 | A | 1/1992 | Nabha et al. | 362/465 |
| 5,087,881 | A | 2/1992 | Peacock | 324/378 |
| 5,095,223 | A | 3/1992 | Thomas | 307/110 |
| 5,108,320 | A | 4/1992 | Kimber | 439/883 |
| 5,109,213 | A | 4/1992 | Williams | 340/447 |
| 5,126,675 | A | 6/1992 | Yang | 324/435 |
| 5,130,658 | A | 7/1992 | Bohmer | 324/435 |
| 5,140,269 | A | 8/1992 | Champlin | 324/433 |
| 5,144,218 | A | 9/1992 | Bosscha | 320/139 |
| 5,144,248 | A | 9/1992 | Alexandres et al. | 324/428 |
| D330,338 | S | 10/1992 | Wang | D10/77 |
| 5,159,272 | A | 10/1992 | Rao et al. | 324/429 |
| 5,160,881 | A | 11/1992 | Schramm et al. | 322/7 |
| 5,164,653 | A | 11/1992 | Reem | |
| 5,168,208 | A | 12/1992 | Schultz et al. | 322/25 |
| 5,170,124 | A | 12/1992 | Blair et al. | 324/434 |
| 5,179,335 | A | 1/1993 | Nor | 320/159 |
| 5,187,382 | A | 2/1993 | Kondo | 307/10.1 |

(56) References Cited

U.S. PATENT DOCUMENTS

| | | | |
|---|---|---|---|
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,223,747 A | 6/1993 | Tschulena | 257/713 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,345,384 A | 9/1994 | Przybyla et al. | 701/29.1 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,384,540 A | 1/1995 | Dessel | 324/539 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 29/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,631,831 A | 5/1997 | Bird et al. | 701/34.4 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | 320/134 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 320/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A | 2/1999 | Takahashi | 320/104 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |

(56) References Cited

U.S. PATENT DOCUMENTS

| | | | |
|---|---|---|---|
| 5,884,202 A | 3/1999 | Arjomand | 701/31.4 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,916,287 A | 6/1999 | Arjomand et al. | 701/33.2 |
| 5,927,938 A | 7/1999 | Hammerslag | 414/809 |
| 5,929,609 A | 7/1999 | Joy et al. | 322/25 |
| 5,935,180 A | 8/1999 | Fieramosca et al. | 701/29.6 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,953,322 A | 9/1999 | Kimball | 370/328 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,963,012 A | 10/1999 | Garcia et al. | 320/106 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,081,154 A | 6/2000 | Ezell et al. | 327/540 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,121,880 A | 9/2000 | Scott et al. | 340/572.5 |
| 6,136,914 A | 10/2000 | Hergenrother et al. | 524/495 |
| 6,137,269 A | 10/2000 | Champlin | 320/150 |
| 6,140,797 A | 10/2000 | Dunn | 320/105 |
| 6,141,608 A | 10/2000 | Rother | 701/29.6 |
| 6,144,185 A | 11/2000 | Dougherty et al. | 320/132 |
| 6,147,598 A | 11/2000 | Murphy et al. | 340/426.19 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A * | 12/2000 | Bertness | G01R 31/3627 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,184,656 B1 | 2/2001 | Karunasiri et al. | 320/119 |
| 6,191,557 B1 | 2/2001 | Gray et al. | 320/132 |
| 6,202,739 B1 | 3/2001 | Pal et al. | 165/104.33 |
| 6,211,651 B1 | 4/2001 | Nemoto | 320/133 |
| 6,211,653 B1 | 4/2001 | Stasko | 320/132 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,225,898 B1 | 5/2001 | Kamiya et al. | 340/505 |
| 6,236,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,262,692 B1 | 7/2001 | Babb | 343/895 |
| 6,263,268 B1 | 7/2001 | Nathanson | 701/29 |
| 6,263,322 B1 | 7/2001 | Kirkevold et al. | 705/400 |
| 6,271,643 B1 | 8/2001 | Becker et al. | 320/112 |
| 6,271,748 B1 | 8/2001 | Derbyshire et al. | 340/442 |
| 6,272,387 B1 | 8/2001 | Yoon | 700/83 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,320,385 B1 | 11/2001 | Burl et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 * | 5/2002 | Cervas | G01R 31/3662 324/426 |
| 6,389,337 B1 | 5/2002 | Kolls | 701/31.6 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,433,512 B1 | 8/2002 | Birkler et al. | 320/132 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |

(56) References Cited

U.S. PATENT DOCUMENTS

| | | | |
|---|---|---|---|
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,473,659 B1 | 10/2002 | Shah et al. | 700/79 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,505,507 B1 | 1/2003 | Imao et al. | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,533,316 B2 | 3/2003 | Breed et al. | 280/735 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 24/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,636,790 B1 | 10/2003 | Lightner et al. | 701/31.5 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,732,031 B1 | 5/2004 | Lightner et al. | 701/31.4 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness et al. | 324/426 |
| 6,771,073 B2 | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,832,141 B2 | 12/2004 | Skeen et al. | 701/31.4 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,162 B1 | 2/2005 | Greatorex et al. | 324/764.01 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,911,825 B2 | 6/2005 | Namaky | 324/426 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,957,133 B1 | 10/2005 | Hunt et al. | 701/32.4 |
| 6,967,484 B2 | 11/2005 | Bertness | 324/426 |
| 6,972,662 B1 | 12/2005 | Ohkawa et al. | 340/10.1 |
| 6,983,212 B2 | 1/2006 | Burns | 702/63 |
| 6,988,053 B2 * | 1/2006 | Namaky | G01R 31/007 320/104 |
| 6,993,421 B2 | 1/2006 | Pillar et al. | 701/29.4 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,042,346 B2 | 5/2006 | Paulsen | 340/438 |
| 7,049,822 B2 * | 5/2006 | Kung | G01R 31/3627 324/426 |
| 7,058,525 B2 | 6/2006 | Bertness et al. | 702/63 |
| 7,069,979 B2 | 7/2006 | Tobias | 165/104.33 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,170,393 B2 | 1/2007 | Martin | 340/10.1 |
| 7,177,925 B2 | 2/2007 | Carcido et al. | 709/223 |
| 7,182,147 B2 | 2/2007 | Cutler et al. | 173/1 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2 | 4/2007 | Reynolds et al. | 320/166 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al | 700/276 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,505,856 B2 | 3/2009 | Restaino et al. | 702/63 |
| 7,545,146 B2 | 6/2009 | Klang et al. | 324/426 |
| 7,557,586 B1 | 7/2009 | Vonderhaar et al. | 324/437 |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |

(56) References Cited

U.S. PATENT DOCUMENTS

| | | | | |
|---|---|---|---|---|
| 7,598,699 | B2 | 10/2009 | Restaino et al. | 320/105 |
| 7,598,743 | B2 | 10/2009 | Bertness | 324/426 |
| 7,598,744 | B2 | 10/2009 | Bertness et al. | 324/426 |
| 7,619,417 | B2 | 11/2009 | Klang | 324/427 |
| 7,642,786 | B2 | 1/2010 | Philbrook | 324/426 |
| 7,642,787 | B2 | 1/2010 | Bertness et al. | 324/426 |
| 7,656,162 | B2 | 2/2010 | Vonderhaar et al. | 324/426 |
| 7,657,386 | B2 | 2/2010 | Thibedeau et al. | 702/63 |
| 7,667,437 | B2 | 2/2010 | Johnson et al. | 320/150 |
| 7,679,325 | B2 | 3/2010 | Seo | 320/116 |
| 7,684,908 | B1 | 3/2010 | Ogilvie et al. | 701/29.6 |
| 7,688,074 | B2 | 3/2010 | Cox et al. | 324/426 |
| 7,698,179 | B2 | 4/2010 | Leung et al. | 705/28 |
| 7,705,602 | B2 | 4/2010 | Bertness | 324/426 |
| 7,706,991 | B2 | 4/2010 | Bertness et al. | 702/63 |
| 7,710,119 | B2 | 5/2010 | Bertness | 324/426 |
| 7,723,993 | B2 | 5/2010 | Klang | 324/431 |
| 7,728,556 | B2 | 6/2010 | Yano et al. | 320/134 |
| 7,728,597 | B2 | 6/2010 | Bertness | 324/426 |
| 7,743,788 | B2* | 6/2010 | Schmitt | C02F 9/005 137/554 |
| 7,751,953 | B2 | 7/2010 | Namaky | 701/33.2 |
| 7,772,850 | B2 | 8/2010 | Bertness | 324/426 |
| 7,774,151 | B2 | 8/2010 | Bertness | 702/63 |
| 7,777,612 | B2 | 8/2010 | Sampson et al. | 340/426.1 |
| 7,791,348 | B2 | 9/2010 | Brown et al. | 324/426 |
| 7,808,375 | B2 | 10/2010 | Bertness et al. | 340/455 |
| 7,848,857 | B2 | 12/2010 | Nasr et al. | 701/22 |
| 7,883,002 | B2 | 2/2011 | Jin et al. | 235/376 |
| 7,902,990 | B2 | 3/2011 | Delmonico et al. | 340/636.1 |
| 7,924,015 | B2 | 4/2011 | Bertness | 324/427 |
| 7,940,053 | B2 | 5/2011 | Brown et al. | 324/426 |
| 7,999,505 | B2 | 8/2011 | Bertness | 320/104 |
| 8,164,343 | B2 | 4/2012 | Bertness | 324/503 |
| 8,222,868 | B2* | 7/2012 | Buckner | G01R 1/0408 320/136 |
| 8,306,690 | B2 | 11/2012 | Bertness et al. | 701/34.4 |
| 8,449,560 | B2* | 5/2013 | Roth | A61B 17/0218 227/175.1 |
| 8,594,957 | B2* | 11/2013 | Gauthier | G01R 31/002 324/458 |
| 8,827,729 | B2* | 9/2014 | Gunreben | H01R 13/658 439/188 |
| 2001/0035737 | A1 | 11/2001 | Nakanishi et al. | 320/122 |
| 2001/0048215 | A1 | 12/2001 | Breed | 280/728.1 |
| 2002/0004694 | A1 | 1/2002 | McLeod et al. | 701/29 |
| 2002/0007237 | A1 | 1/2002 | Phung et al. | 701/33 |
| 2002/0010558 | A1 | 1/2002 | Bertness et al. | 702/63 |
| 2002/0021135 | A1 | 2/2002 | Li et al. | 324/677 |
| 2002/0027346 | A1 | 3/2002 | Breed et al. | 280/735 |
| 2002/0030495 | A1 | 3/2002 | Kechmire | 324/427 |
| 2002/0036504 | A1 | 3/2002 | Troy et al. | 324/430 |
| 2002/0041175 | A1 | 4/2002 | Lauper et al. | 320/106 |
| 2002/0044050 | A1 | 4/2002 | Derbyshire et al. | 340/442 |
| 2002/0047711 | A1 | 4/2002 | Bertness et al. | 324/426 |
| 2002/0050163 | A1 | 5/2002 | Makhija et al. | 73/116 |
| 2002/0074398 | A1 | 6/2002 | Lancos et al. | 235/382 |
| 2002/0118111 | A1 | 8/2002 | Brown et al. | 340/573.1 |
| 2002/0121901 | A1 | 9/2002 | Hoffman | 324/426 |
| 2002/0128985 | A1 | 9/2002 | Greenwald | 705/400 |
| 2002/0171428 | A1 | 11/2002 | Bertness | 702/63 |
| 2002/0176010 | A1 | 11/2002 | Wallach et al. | 348/362 |
| 2003/0006779 | A1 | 1/2003 | H. Youval | 324/503 |
| 2003/0009270 | A1 | 1/2003 | Breed | 701/29 |
| 2003/0017753 | A1 | 1/2003 | Palmisano et al. | 439/762 |
| 2003/0025481 | A1 | 2/2003 | Bertness | 324/427 |
| 2003/0036909 | A1 | 2/2003 | Kato | 704/275 |
| 2003/0040873 | A1 | 2/2003 | Lesesky et al. | 702/57 |
| 2003/0060953 | A1 | 3/2003 | Chen | 701/33 |
| 2003/0078743 | A1 | 4/2003 | Bertness et al. | 702/63 |
| 2003/0088375 | A1 | 5/2003 | Bertness et al. | 702/63 |
| 2003/0124417 | A1 | 7/2003 | Bertness et al. | 429/90 |
| 2003/0128011 | A1 | 7/2003 | Bertness et al. | |
| 2003/0128036 | A1 | 7/2003 | Henningson et al. | 324/426 |
| 2003/0137277 | A1 | 7/2003 | Mori et al. | 320/132 |
| 2003/0169018 | A1 | 9/2003 | Berels et al. | 320/132 |
| 2003/0169019 | A1 | 9/2003 | Oosaki | 320/132 |
| 2003/0171111 | A1 | 9/2003 | Clark | 455/414.1 |
| 2003/0177417 | A1 | 9/2003 | Malhotra et al. | 714/42 |
| 2003/0184262 | A1 | 10/2003 | Makhija | 320/156 |
| 2003/0184306 | A1 | 10/2003 | Bertness et al. | 324/426 |
| 2003/0187556 | A1 | 10/2003 | Suzuki | 701/29 |
| 2003/0194672 | A1 | 10/2003 | Roberts et al. | 431/196 |
| 2003/0197512 | A1 | 10/2003 | Miller et al. | 324/426 |
| 2003/0212311 | A1 | 11/2003 | Nova et al. | 600/300 |
| 2003/0214395 | A1 | 11/2003 | Flowerday et al. | 340/445 |
| 2003/0236656 | A1 | 12/2003 | Dougherty | 703/14 |
| 2004/0000590 | A1 | 1/2004 | Raichle et al. | 235/462.01 |
| 2004/0000891 | A1 | 1/2004 | Raichle et al. | 320/107 |
| 2004/0000893 | A1 | 1/2004 | Raichle et al. | 320/135 |
| 2004/0000913 | A1 | 1/2004 | Raichle et al. | 324/426 |
| 2004/0000915 | A1 | 1/2004 | Raichle et al. | 324/522 |
| 2004/0002824 | A1 | 1/2004 | Raichle et al. | 702/63 |
| 2004/0002825 | A1 | 1/2004 | Raichle et al. | 702/63 |
| 2004/0002836 | A1 | 1/2004 | Raichle et al. | 702/188 |
| 2004/0032264 | A1 | 2/2004 | Schoch | 324/426 |
| 2004/0036443 | A1 | 2/2004 | Bertness | 320/109 |
| 2004/0044452 | A1 | 3/2004 | Bauer et al. | 703/33 |
| 2004/0044454 | A1 | 3/2004 | Ross et al. | 701/33 |
| 2004/0049361 | A1 | 3/2004 | Hamdan et al. | 702/115 |
| 2004/0051533 | A1 | 3/2004 | Namaky | 324/426 |
| 2004/0051534 | A1 | 3/2004 | Kobayashi et al. | 324/429 |
| 2004/0054503 | A1 | 3/2004 | Namaky | 702/182 |
| 2004/0064225 | A1 | 4/2004 | Jammu et al. | 701/29 |
| 2004/0088087 | A1 | 5/2004 | Fukushima et al. | 701/32 |
| 2004/0113588 | A1 | 6/2004 | Mikuriya et al. | 320/128 |
| 2004/0145342 | A1 | 7/2004 | Lyon | 320/108 |
| 2004/0164706 | A1 | 8/2004 | Osborne | 320/116 |
| 2004/0172177 | A1 | 9/2004 | Nagai et al. | 701/29 |
| 2004/0178185 | A1 | 9/2004 | Yoshikawa et al. | 219/270 |
| 2004/0189309 | A1 | 9/2004 | Bertness et al. | 324/426 |
| 2004/0199343 | A1 | 10/2004 | Cardinal et al. | 702/63 |
| 2004/0207367 | A1 | 10/2004 | Taniguchi et al. | 320/149 |
| 2004/0227523 | A1 | 11/2004 | Namaky | 324/537 |
| 2004/0239332 | A1 | 12/2004 | Mackel et al. | 324/426 |
| 2004/0251876 | A1 | 12/2004 | Bertness et al. | 320/136 |
| 2004/0257084 | A1* | 12/2004 | Restaino | G01R 1/02 324/400 |
| 2005/0007068 | A1 | 1/2005 | Johnson et al. | 320/110 |
| 2005/0009122 | A1 | 1/2005 | Whelan et al. | 435/7.32 |
| 2005/0017726 | A1 | 1/2005 | Koran et al. | 324/433 |
| 2005/0021294 | A1 | 1/2005 | Trsar et al. | 702/183 |
| 2005/0025299 | A1 | 2/2005 | Tischer et al. | 379/199 |
| 2005/0043868 | A1 | 2/2005 | Mitcham | 701/29 |
| 2005/0057256 | A1 | 3/2005 | Bertness | 324/426 |
| 2005/0060070 | A1 | 3/2005 | Kapolka et al. | 701/29 |
| 2005/0073314 | A1 | 4/2005 | Bertness et al. | 324/433 |
| 2005/0076381 | A1 | 4/2005 | Gross | 725/107 |
| 2005/0096809 | A1 | 5/2005 | Skeen et al. | 701/29 |
| 2005/0102073 | A1 | 5/2005 | Ingram | 701/29 |
| 2005/0128083 | A1 | 6/2005 | Puzio et al. | 340/572.1 |
| 2005/0128902 | A1 | 6/2005 | Tsai | 369/44.32 |
| 2005/0143882 | A1 | 6/2005 | Umezawa | 701/29 |
| 2005/0159847 | A1 | 7/2005 | Shah et al. | 700/276 |
| 2005/0162172 | A1 | 7/2005 | Bertness | 324/426 |
| 2005/0168226 | A1 | 8/2005 | Quint et al. | 324/426 |
| 2005/0173142 | A1 | 8/2005 | Cutler et al. | 173/181 |
| 2005/0182536 | A1 | 8/2005 | Doyle et al. | 701/29 |
| 2005/0212521 | A1 | 9/2005 | Bertness et al. | 324/426 |
| 2005/0218902 | A1 | 10/2005 | Restaino et al. | 324/433 |
| 2005/0231205 | A1 | 10/2005 | Bertness et al. | 324/426 |
| 2005/0254106 | A9 | 11/2005 | Silverbrook et al. | 358/539 |
| 2005/0256617 | A1 | 11/2005 | Cawthorne et al. | 701/22 |
| 2005/0258241 | A1 | 11/2005 | McNutt et al. | 235/385 |
| 2006/0012330 | A1 | 1/2006 | Okumura et al. | 320/103 |
| 2006/0030980 | A1 | 2/2006 | St. Denis | 701/29 |
| 2006/0043976 | A1 | 3/2006 | Gervais | 324/508 |
| 2006/0089767 | A1 | 4/2006 | Sowa | 701/29 |
| 2006/0095230 | A1 | 5/2006 | Grier et al. | 702/183 |
| 2006/0152224 | A1 | 7/2006 | Kim et al. | 324/430 |
| 2006/0161313 | A1 | 7/2006 | Rogers et al. | 701/1 |
| 2006/0161390 | A1 | 7/2006 | Namaky et al. | 702/183 |
| 2006/0217914 | A1 | 9/2006 | Bertness | 702/113 |
| 2006/0282323 | A1 | 12/2006 | Walker et al. | 705/14 |

(56) References Cited

U.S. PATENT DOCUMENTS

| | | | |
|---|---|---|---|
| 2007/0024460 A1 | 2/2007 | Clark | 340/663 |
| 2007/0026916 A1 | 2/2007 | Juds et al. | 463/1 |
| 2007/0046261 A1 | 3/2007 | Porebski | 320/132 |
| 2007/0088472 A1 | 4/2007 | Ganzhorn et al. | 701/33 |
| 2007/0159177 A1 | 7/2007 | Bertness et al. | 324/426 |
| 2007/0182576 A1 | 8/2007 | Proska et al. | 340/636.1 |
| 2007/0194791 A1 | 8/2007 | Huang | 324/430 |
| 2007/0194793 A1 | 8/2007 | Bertness | 324/503 |
| 2007/0205983 A1 | 9/2007 | Naimo | 345/160 |
| 2007/0259256 A1 | 11/2007 | Le Canut et al. | 429/90 |
| 2008/0036421 A1 | 2/2008 | Seo et al. | 320/132 |
| 2008/0059014 A1 | 3/2008 | Nasr et al. | 701/22 |
| 2008/0086246 A1 | 4/2008 | Bolt et al. | 701/29 |
| 2008/0094068 A1 | 4/2008 | Scott | 324/426 |
| 2008/0169818 A1 | 7/2008 | Lesesky et al. | 324/426 |
| 2008/0303528 A1 | 12/2008 | Kim | 324/430 |
| 2008/0303529 A1 | 12/2008 | Nakamura et al. | 324/433 |
| 2008/0315830 A1 | 12/2008 | Bertness | 320/104 |
| 2009/0006476 A1 | 1/2009 | Andreasen et al. | 707/104.1 |
| 2009/0024266 A1 | 1/2009 | Bertness | 701/22 |
| 2009/0085571 A1 | 4/2009 | Bertness | 324/426 |
| 2009/0146800 A1 | 6/2009 | Grimlund et al. | 340/505 |
| 2009/0198372 A1 | 8/2009 | Hammerslag | 700/292 |
| 2009/0247020 A1 | 10/2009 | Gathman et al. | 439/759 |
| 2009/0276115 A1 | 11/2009 | Chen | 701/32 |
| 2010/0023198 A1 | 1/2010 | Hamilton | 701/29 |
| 2010/0145780 A1 | 6/2010 | Nishikawa et al. | 705/14.11 |
| 2010/0314950 A1 | 12/2010 | Rutkowski et al. | 307/125 |
| 2011/0004427 A1 | 1/2011 | Gorbold et al. | 702/62 |
| 2011/0273181 A1 | 11/2011 | Park et al. | 324/429 |
| 2012/0046824 A1 | 2/2012 | Ruther et al. | 701/31.5 |
| 2012/0116391 A1* | 5/2012 | Houser | A61B 17/320092 606/41 |
| 2013/0158782 A1 | 6/2013 | Bertness et al. | 701/34.4 |

FOREIGN PATENT DOCUMENTS

| | | |
|---|---|---|
| DE | 29 26 716 B1 | 1/1981 |
| DE | 196 38 324 | 9/1996 |
| DE | 10 2008 036 595 A1 | 2/2010 |
| EP | 0 022 450 A1 | 1/1981 |
| EP | 0 391 694 A2 | 4/1990 |
| EP | 0 476 405 A1 | 9/1991 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 807 710 B1 | 7/2007 |
| EP | 1 807 710 | 1/2010 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| JP | 2001057711 A | 2/2001 |
| JP | 2003-346909 | 12/2003 |
| JP | 2006331976 A | 12/2006 |
| JP | 2009-244166 | 10/2009 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |
| WO | WO 2010/007681 | 1/2010 |

OTHER PUBLICATIONS

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice for Maintenance, Testings, and Replacement of Large Lead Storage Batteries for Generating Stations and Substations, *The Institute of Electrical and Electronics Engineers, Inc.*, ANSI/IEEE Std. 450-1987, Mar. 9, 1987, pp. 7-15.

"Field and Laboratory Studies to Asses the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113. 006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design a 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115, Dec. 1994.

"Alligator Clips with Wire Penetrators" *J.S. Popper, Inc.* product information, downloaded from http://www.jspopper.com/, prior to Oct. 1, 2002.

"#12: LM78S40 Simple Switcher DC to DC Converter", *ITM e-Catalog*, downloaded from http://www.pcbcafe.com, prior to Oct. 1, 2002.

(56) References Cited

OTHER PUBLICATIONS

"Simple DC-DC Converts Allows Use of Single Battery",*Electronix Express*, downloaded from http://www.elexp.com/t_dc-dc.htm, prior to Oct. 1, 2002.
"DC-DC Converter Basics", *Power Designers*, downloaded from http://www.powederdesigner.com/InforWeb.design_center/articles/DC-DC/converter.shtm, propr to Oct. 1, 2002.
"Notification of Transmittal of the International Search Report or the Declaration", PCT/US02/29461, filed Sep. 17, 2002 and mailed Jan. 3, 2003.
"Notification of Transmittal of the International Search Report or the Declaration", PCT/US03/07546, filed Mar. 13, 2003 and mailed Jul. 4, 2001.
"Notification of Transmittal of the International Search Report or the Declaration", PCT/US03/06577, filed Mar. 5, 2003 and mailed Jul. 24, 2003.
"Notification of Transmittal of the International Search Report or the Declaration", PCT/US03/07837, filed Mar. 14, 2003 and mailed Jul. 4, 2003.
"Improved Impedance Spectroscopy Technique for Status Determination of Production $Li/SO_2$ Batteries" Terrill Atwater et al., pp. 10-113, (1992).
"Notification of Transmittal of the International Search Report or the Declaration", PCT/US03/41561; Search Report completed Apr. 13, 2004, mailed May 6, 2004.
"Notification of Transmittal of the International Search Report or the Declaration", PCT/US03/27696, filed Sep. 4, 2003 and mailed Apr. 15, 2004.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois pp. 1-1-14-13, (1991).
Supplementary European Search Report Communication for Appl. No. 99917402.2; Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and mailed Npv. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447.4, date of search Jan. 27, 2005, date of document Jan. 28, 2005.
"Results of Discrete Frequency Immittance Spectroscopy (DFIS) Measurements of Lead Acid Batteries", by K.S. Champlin et al., *Proceedings of 23rd International Teleco Conference (INTELEC)*, published Oct. 2001, IEE, pp. 433-440.
"Examination Report" from the UK Patent Office for App. No. 0417678.0; Jan. 24, 2005.
Wikipedia Online Encyclopedia, Inductance, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.

Notification of Transmittal of the International Search Report and Written Opinion of the International Searching Authority, or the Declaration for PCT/US2011/038279 filed May 27, 2011, date of mailing Sep. 16, 2011, 12 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I—Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et la., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Communication from GB1216105.5, dated Sep. 21, 2012.
Notification of Transmittal of the International Search Report and Written Opinion from PCT/US2011/039043, dated Jul. 26, 2012.

(56) References Cited

OTHER PUBLICATIONS

Notification of Transmittal of the International Search Report and Written Opinion from PCT/US2011/053886, dated Jul. 27, 2012.
"Field Evaluation of Honda's EV Plus Battery Packs", by A. Paryani, *IEEE AES Systems Magazine*, Nov. 2000, pp. 21-2
Search Report from PCT/US2011/047354; dated Nov. 11, 2011.
Written Opinion from PCT/US2011/047354; dated Nov. 11, 2011.
First Office Action (Notification of Reasons for Rejections) dated Dec. 3, 2013 in related Japanese patent application No. 2013-513370; 9 pgs. Including English Translation.
Official Action dated Jan. 22, 2014 in Korean patent application No. 10-2012-7033020; 2 pgs. including English Translation.
Official Action dated Feb. 20, 2014 in Korean patent application No. 10-2013-7004814; 6 pgs. including English Translation.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 112011102064.3 dated Aug. 28, 2014.
Office Action from Japanese Patent Application No. 2013-513370, dated Aug. 5, 2014.
Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.

\* cited by examiner

US 9,244,100 B2

CURRENT CLAMP WITH JAW CLOSURE DETECTION

CROSS-REFERENCE TO RELATED APPLICATION

The present application is based on and claims the benefit of U.S. provisional patent application Ser. No. 61/789,189, filed Mar. 15, 2013, the content of which is hereby incorporated by reference in its entirety.

BACKGROUND

The present invention relates to a current clamp. More specifically, the present invention relates to detecting closure of jaws on a current clamp.

A current clamp (also known as a current probe or amp clamp) is an electrical device that has a pair of jaws, which, when closed, form a closed curve (such as a circle or oval). When the jaws are closed around an electrical conductor, properties of the electric current flowing in the conductor can be measured, without requiring physical contact with the conductor or disconnection of the conductor for insertion through the probe. Current clamps can be used to read the magnitude of an alternating current. Also, in conjunction with more advanced instrumentation, the phase and wave form of the current can be detected as well.

One type of current clamp comprises a split ring of ferrite or soft iron. The split ring is split into two halves, each of which have a wire coil wound therearound. The wire coil forms one winding of a current transformer. When the current clamp is placed around a conductor, the conductor forms the other winding.

Another type of current clamp is referred to as an iron vane clamp. In this type of current clamp, the magnetic flux in the core directly affects a moving iron vane that allows both A/C and D/C current to be measured. It also gives a true RMS value for non-sinusoidal A/C wave forms.

Yet another type of clamp, with a meter, is referred to as a Hall Effect meter. This type of meter is more sensitive and is able to measure both D/C and A/C current. Normally, a current clamp only works when it is placed around one conductor of a circuit under test. The reason is that if it is placed around both conductors, the magnetic fields cancel.

When the current clamp is integrally combined with an electrical meter, the device is known as a clamp meter (and is also sometimes referred to as a clamp-on ammeter or tong tester). Clamp meters can also be used to measure electrical power and energy. The clamp is used to measure the current and other circuitry measures the voltage. The true power is the product of the instantaneous voltage and current integrated over a cycle.

The accuracy of each of these devices can be affected if the jaws do not fully close around the conductor. When this occurs, the magnetic loop is not continuous, and the meter reading associated with the current clamp is erroneous (and usually too low).

SUMMARY

A current clamp has a pair of jaws that are placed around an electrical conductor to measure a parameter (a measurable quantity or a distinguishing or notable characteristic) corresponding to the electrical conductor.

DETAILED DESCRIPTION OF ILLUSTRATIVE EMBODIMENTS

Figure 1:
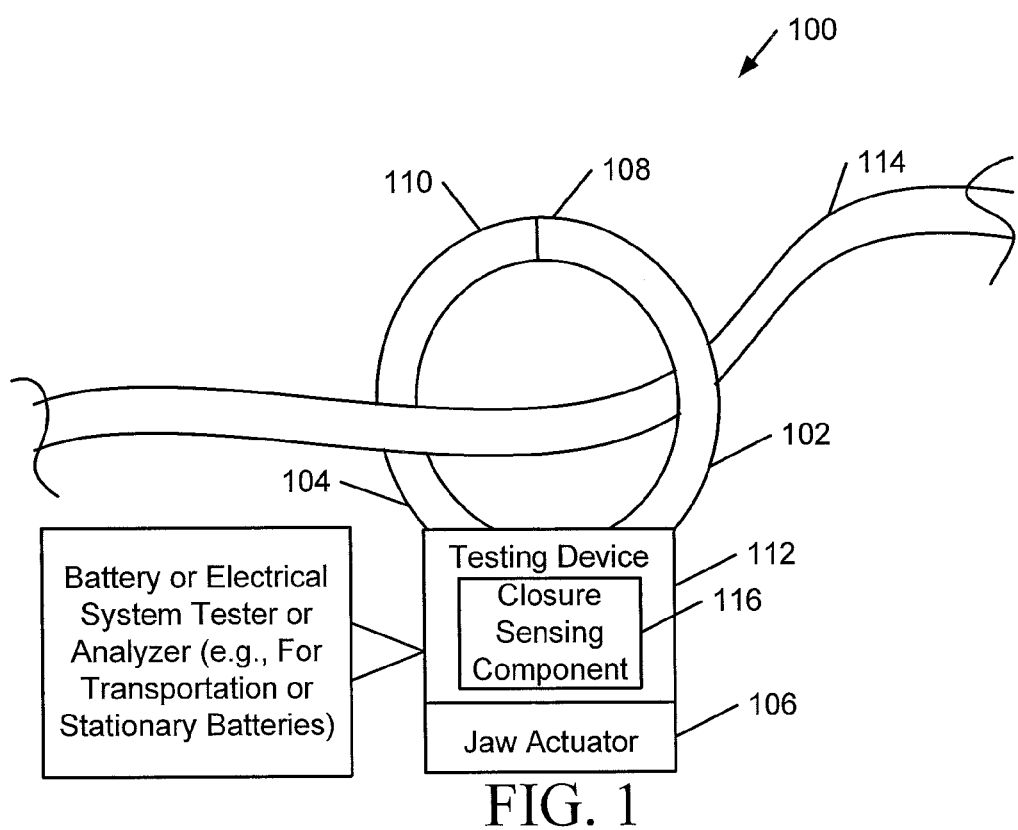
FIG. 1 is a partial block diagram, partial pictorial diagram of a current clamp.

The present invention can be used with battery and vehicle testing and maintenance techniques and devices such as those by Midtronics Inc. and Professor Keith Champlin as shown and described in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. No. 6,456,045; U.S. Pat. No. 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 2005; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Pat. No. 8,164,343, issued Apr. 24, 2012; U.S. Pat. No. 8,198,900, issued Jun. 12, 2012; U.S. Pat. No. 8,203,345, issued Jun. 19, 2012; U.S. Pat. No. 8,237,448, issued Aug. 7, 2012; U.S. Pat. No. 8,306,690, issued Nov. 6, 2012; U.S. Pat. No. 8,344,685, issued Jan. 1, 2013; U.S. Pat. No. 8,436,619, issued May 7, 2013; U.S. Pat. No. 8,442,877, issued May 14, 2013; U.S. Pat. No. 8,493,022, issued Jul. 23, 2013; U.S. Pat. No. D687,727, issued Aug. 13, 2013; U.S. Pat. No. 8,513,949, issued Aug. 20, 2013; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 10/867,385, filed Jun. 14, 2004, entitled ENERGY MANAGEMENT SYSTEM FOR AUTOMOTIVE VEHICLE; U.S. Ser. No. 10/958,812, filed Oct. 5, 2004, entitled SCAN TOOL FOR ELECTRONIC BATTERY TESTER; U.S. Ser. No. 60/587,232, filed Dec. 14, 2004, entitled CELLTRON ULTRA, U.S. Ser. No. 60/653,537, filed Feb. 16, 2005, entitled CUSTOMER MANAGED WARRANTY CODE; U.S. Ser. No. 60/665,070, filed Mar. 24, 2005, entitled OHMMETER PROTECTION CIRCUIT; U.S. Ser. No. 60/694,199, filed Jun. 27, 2005, entitled GEL BATTERY CONDUCTANCE COMPENSATION; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No.

60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/356,443, filed Feb. 16, 2006, entitled ELECTRONIC BATTERY TESTER WITH NETWORK COMMUNICATION; U.S. Ser. No. 11/519,481, filed Sep. 12, 2006, entitled BROAD-BAND LOW-CONDUCTANCE CABLES FOR MAKING KELVIN CONNECTIONS TO ELECTROCHEMICAL CELLS AND BATTERIES; U.S. Ser. No. 60/847,064, filed Sep. 25, 2006, entitled STATIONARY BATTERY MONITORING ALGORITHMS; U.S. Ser. No. 11/641,594, filed Dec. 19, 2006, entitled METHOD AND APPARATUS FOR MEASURING A PARAMETER OF A VEHICLE ELECTRONIC SYSTEM; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 60/992,798, filed Dec. 6, 2007, entitled STORAGE BATTERY AND BATTERY TESTER; U.S. Ser. No. 61/061,848, filed Jun. 16, 2008, entitled KELVIN CLAMP FOR ELECTRONICALLY COUPLING TO A BATTERY CONTACT; U.S. Ser. No. 12/498,642, filed Jul. 7, 2009, entitled ELECTRONIC BATTERY TESTER; U.S. Ser. No. 12/697,485, filed Feb. 1, 2010, entitled ELECTRONIC BATTERY TESTER; U.S. Ser. No. 12/712,456, filed Feb. 25, 2010, entitled METHOD AND APPARATUS FOR DETECTING CELL DETERIORATION IN AN ELECTROCHEMICAL CELL OR BATTERY; U.S. Ser. No. 61/311,485, filed Mar. 8, 2010, entitled BATTERY TESTER WITH DATABUS FOR COMMUNICATING WITH VEHICLE ELECTRICAL SYSTEM; U.S. Ser. No. 61/313,893, filed Mar. 15, 2010, entitled USE OF BATTERY MANUFACTURE/SELL DATE IN DIAGNOSIS AND RECOVERY OF DISCHARGED BATTERIES; U.S. Ser. No. 12/758,407, filed Apr. 12, 2010, entitled ELECTRONIC BATTERY TESTER WITH NETWORK COMMUNICATION; U.S. Ser. No. 12/769,911, filed Apr. 29, 2010, entitled STATIONARY BATTERY TESTER; U.S. Ser. No. 61/330,497, filed May 3, 2010, entitled MAGIC WAND WITH ADVANCED HARNESS DETECTION; U.S. Ser. No. 61/348,901, filed May 27, 2010, entitled ELECTRONIC BATTERY TESTER; U.S. Ser. No. 61/351,017, filed Jun. 3, 2010, entitled IMPROVED ELECTRIC VEHICLE AND HYBRID ELECTRIC VEHICLE BATTERY MODULE BALANCER; U.S. Ser. No. 12/818,290, filed Jun. 18, 2010, entitled BATTERY MAINTENANCE DEVICE WITH THERMAL BUFFER; U.S. Ser. No. 61/373,045, filed Aug. 12, 2010, entitled ELECTRONIC BATTERY TESTER FOR TESTING STATIONERY STORAGE BATTERY; U.S. Ser. No. 12/888,689, filed Sep. 23, 2010, entitled BATTERY TESTER FOR ELECTRIC VEHICLE; U.S. Ser. No. 12/894,951, filed Sep. 30, 2010, entitled BATTERY PACK MAINTENANCE FOR ELECTRIC VEHICLES; U.S. Ser. No. 61/411,162, filed Nov. 8, 2010, entitled ELECTRONIC BATTERY TESTER; U.S. Ser. No. 13/037,641, filed Mar. 1, 2011, entitled MONITOR FOR FRONT TERMINAL BATTERIES; U.S. Ser. No. 13/037,641 Mar. 1, 2011, entitled: MONITOR FOR FRONT TERMINAL BATTERIES; U.S. Ser. No. 13/048,365, filed Mar. 15, 2011, entitled ELECTRONIC BATTERY TESTER WITH BATTERY AGE UNIT; U.S. Ser. No. 13/098,661, filed May 2, 2011, entitled METHOD AND APPARATUS FOR MEASURING A PARAMETER OF A VEHICLE ELECTRICAL SYSTEM; U.S. Ser. No. 13/113,272, filed May 23, 2011, entitled ELECTRONIC STORAGE BATTERY DIAGNOSTIC SYSTEM; U.S. Ser. No. 13/152,711, filed Jun. 3, 2011, entitled BATTERY PACK MAINTENANCE FOR ELECTRIC VEHICLE; U.S. Ser. No. 13/205,949, filed Aug. 9, 2011, entitled ELECTRONIC BATTERY TESTER FOR TESTING STORAGE BATTERY; U.S. Ser. No. 13/205,904, filed Aug. 9, 2011, entitled IN-VEHICLE BATTERY MONITOR; U.S. Ser. No. 13/270,828, filed Oct. 11, 2011, entitled SYSTEM FOR AUTOMATICALLY GATHERING BATTERY INFORMATION; U.S. Ser. No. 13/276,639, filed Oct. 19, 2011, entitled METHOD AND APPARATUS FOR MEASURING A PARAMETER OF A VEHICLE ELECTRICAL SYSTEM; U.S. Ser. No. 61/558,088, filed Nov. 10, 2011, entitled BATTERY PACK TESTER; U.S. Ser. No. 13/357,306, filed Jan. 24, 2012, entitled STORAGE BATTERY AND BATTERY TESTER; U.S. Ser. No. 61/665,555, filed Jun. 28, 2012, entitled HYBRID AND ELECTRIC VEHICLE BATTERY MAINTENANCE DEVICE; and U.S. Ser. No. 13/567,463, filed Aug. 6, 2012, entitled BATTERY TESTERS WITH SECONDARY FUNCTIONALITY; U.S. Ser. No. 13/668,523, filed Nov. 5, 2012, entitled BATTERY TESTER FOR ELECTRIC VEHICLE; U.S. Ser. No. 13/672,186, filed Nov. 8, 2012, entitled BATTERY PACK TESTER; U.S. Ser. No. 13/687,673, filed Nov. 28, 2012, entitled SYSTEM FOR AUTOMATICALLY GATHERING BATTERY INFORMATION; U.S. Ser. No. 61/777,360, filed Mar. 12, 2013, entitled DETERMINATION OF STARTING CURRENT IN AN AUTOMOTIVE VEHICLE; U.S. Ser. No. 61/777,392, filed Mar. 12, 2013, entitled DETERMINATION OF CABLE DROP DURING A STARTING EVENT IN AN AUTOMOTIVE VEHICLE; U.S. Ser. No. 13/827,128, filed Mar. 14, 2013, entitled HYBRID AND ELECTRIC VEHICLE BATTERY MAINTENANCE DEVICE; U.S. Ser. No. 61/789,189, filed Mar. 15, 2013, entitled CURRENT CLAMP WITH JAW CLOSURE DETECTION; U.S. Ser. No. 61/824,056, filed May 16, 2013, entitled BATTERY TESTING SYSTEM AND METHOD; U.S. Ser. No. 61/859,991, filed Jul. 30, 2013, entitled METHOD AND APPARATUS FOR MONITORING A PLURALITY OF STORAGE BATTERIES IN A STATIONARY BACK-UP POWER SYSTEM; U.S. Ser. No. 14/039,746, filed Sep. 27, 2013, entitled BATTERY PACK MAINTENANCE FOR ELECTRIC VEHICLE; U.S. Ser. No. 61/915,157, filed Dec. 12, 2013, entitled BATTERY TESTER AND BATTERY REGISTRATION TOOL; U.S. Ser. No. 61/928,167, filed Jan. 16, 2014, entitled BATTERY CLAMP WITH ENDOSKELETON DESIGN; all of which are incorporated herein by reference in their entireties.

FIG. 1 is a block diagram of one illustrative embodiment of a current clamp 100. Current clamp 100 illustratively includes a pair of jaws 102 and 104 that can be opened and closed using jaw actuator 106. When jaws 102 and 104 close together, they illustratively contact one another at their distal tips 108 and 110, respectively. Current clamp 100 also illustratively includes a testing device 112 that is used to measure a parameter of conductor 114 (e.g., the current flowing through conductor 114). This may be spaced apart from the jaws 102, 104, or can be formed integrally as illustrated.

Testing device 112 can be a wide variety of different kinds of devices. For instance, FIG. 1 shows one example where testing device 112 is a battery or electrical system tester or analyzer (collectively referred to as a battery tester). It can be for transportation batteries (e.g., batteries used in vehicles) or for stationary batteries (e.g., those used in communication systems) or other systems. These are examples only. Other examples, such as where the testing device is a handheld current meter, can also be used, and some of them are discussed below.

In the embodiment shown in FIG. 1, current clamp 100 also includes a closure sensor component 116. As discussed in the background portion, when jaws 102 and 104 do not close, so that their distal tips 108 and 110 do not contact one another, testing device 112 can tend to produce an inaccurate measurement of the parameter (e.g., the current or another parameter) of conductor 114. Therefore, in the embodiment shown in FIG. 1, current clamp 100 includes closure sensing component 116. While closure sensing component 116 is shown disposed on testing device 112, it can illustratively be disposed at substantially any location. A number of different embodiments are discussed below with respect to FIGS. 2-6.

In operation, a user illustratively actuates jaw actuator 106 to separate jaws 102 and 104 from one another at their distal tips 108 and 110. The user then places conductor 114 between jaws 102 and 104 and either actuates jaw actuator 106 (or simply releases jaw actuator 106) to bring jaws 102 and 104 together so that their distal tips 108 and 110 are in contact with one another, as shown in FIG. 1.

Closure sensing component 116 illustratively provides a signal to testing device 112 indicating whether the jaws 102 and 104 are fully closed. If not, a user-observable indicator is provided to the user so that the user knows that the jaws are not closed, and can take remedial action. If the jaws are closed, then testing device 112 can illustratively measure the parameter and provide an output indicative of that parameter.

Figure 1A:
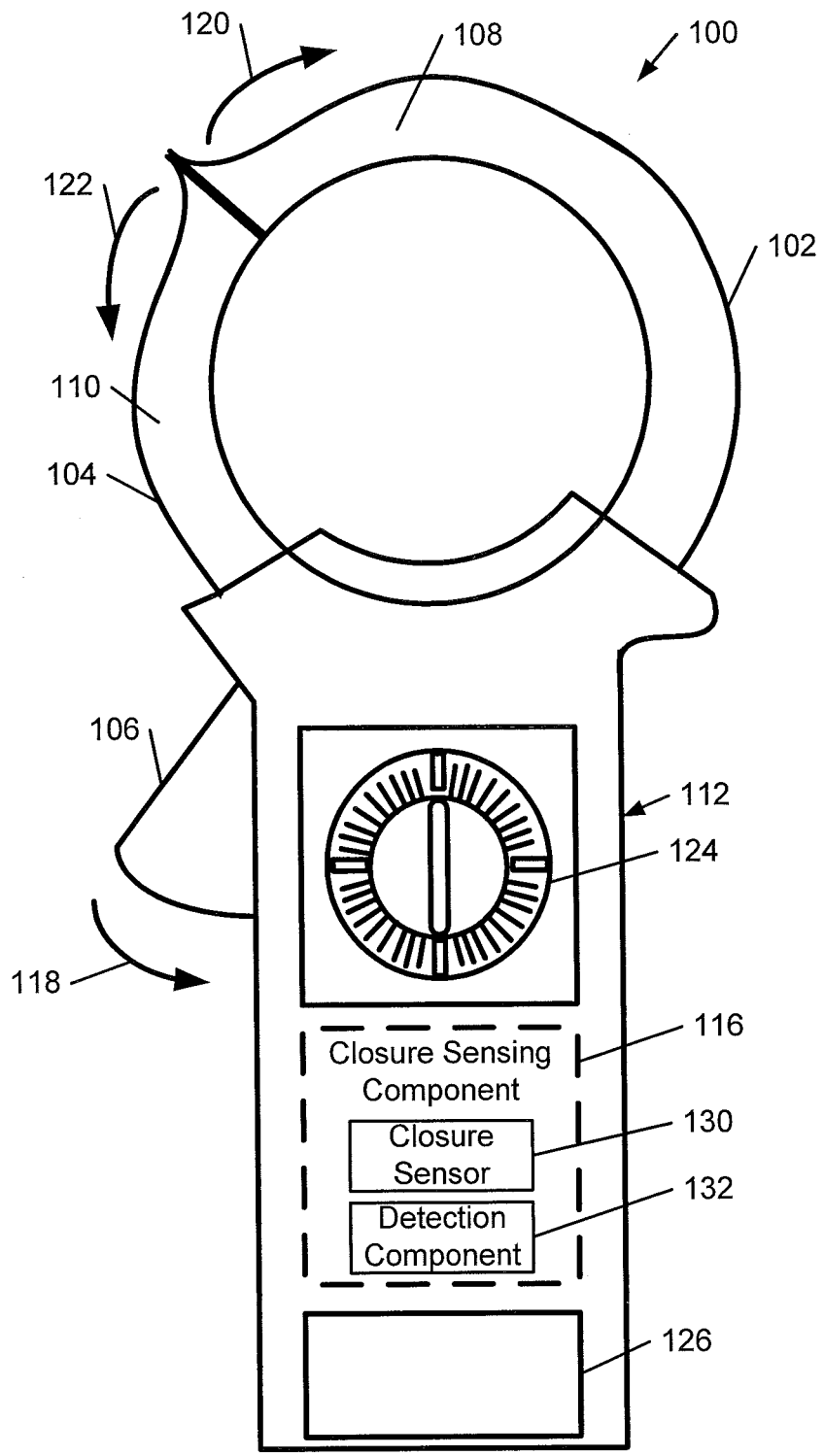
FIG. 1A is a diagram of a current clamp with a meter.

FIG. 1A is a pictorial illustration of one embodiment of current clamp 100 in more detail. Some of the items shown in FIG. 1A are similar to those shown in FIG. 1, and they are similarly numbered. In the embodiment shown in FIG. 1A, actuator 106 comprises a depressible lever or paddle. When the user grips testing device 112 and pushes actuator 106 in the direction generally indicated by arrow 118, this causes the distal tips 108 and 110 of jaws 102 and 104 to open in the directions indicated by arrows 120 and 122, respectively. Thus, the jaws open so that the user can place conductor 114 there between. When the user releases actuator 106 (by ceasing to press on it), jaws 102 and 104 are illustratively biased to the closed position shown in FIG. 1A, so that distal tips 108 and 110 again come into contact with one another.

In the embodiment shown in FIG. 1A, testing device 112 illustratively includes a user input mechanism, such as dial 124. This can provide the user with a number of different options. For instance, dial 124 can be used to change the particular parameter that testing device 112 is set to measure. Similarly, dial 124 can be used to change the sensitivity of current clamp 100 or to modify other operating characteristics of current clamp 100, as desired.

The current clamp 100 shown in FIG. 1A also illustratively includes a user interface display device 126. Display device 126 is illustratively a visual display (such as an LCD display, an LED display, or any other type of display) that provides a visual display of the measured parameter. It can also be used to provide a user display indicative of whether closure sensing component 116 senses that jaws 102 and 104 are completely closed, or whether they are still open. Of course, display device 126 can be used to generate a wide variety of other displays as well.

FIG. 1A also shows closure sensing component 116 in more detail. In the embodiment shown in FIG. 1A, closure sensing component 116 illustratively includes a closure sensor 130 and a closure detection component 132. Closure sensor 130 (as will be described in greater detail below) illustratively senses whether the distal ends 108 and 110 of jaws 102 and 104 are in contact with one another. Closure sensor 130 illustratively provides a signal indicative of this to closure detection component 132. Based on the signal from closure sensor 130, closure detection component 132 illustratively determines whether the jaws are open or closed. By way of one exemplary embodiment, closure sensor 130 may illustratively be a switch that detects that the ends 108 and 110 of jaws 102 and 104 are in contact with one another. Closure detection component 132 may illustratively be the electrical circuitry that receives the signal from the switch and determines whether the jaws are open or closed based on that signal. Of course, other embodiments can be used, and some of these are discussed below with respect to FIGS. 2-6.

Figure 1B:
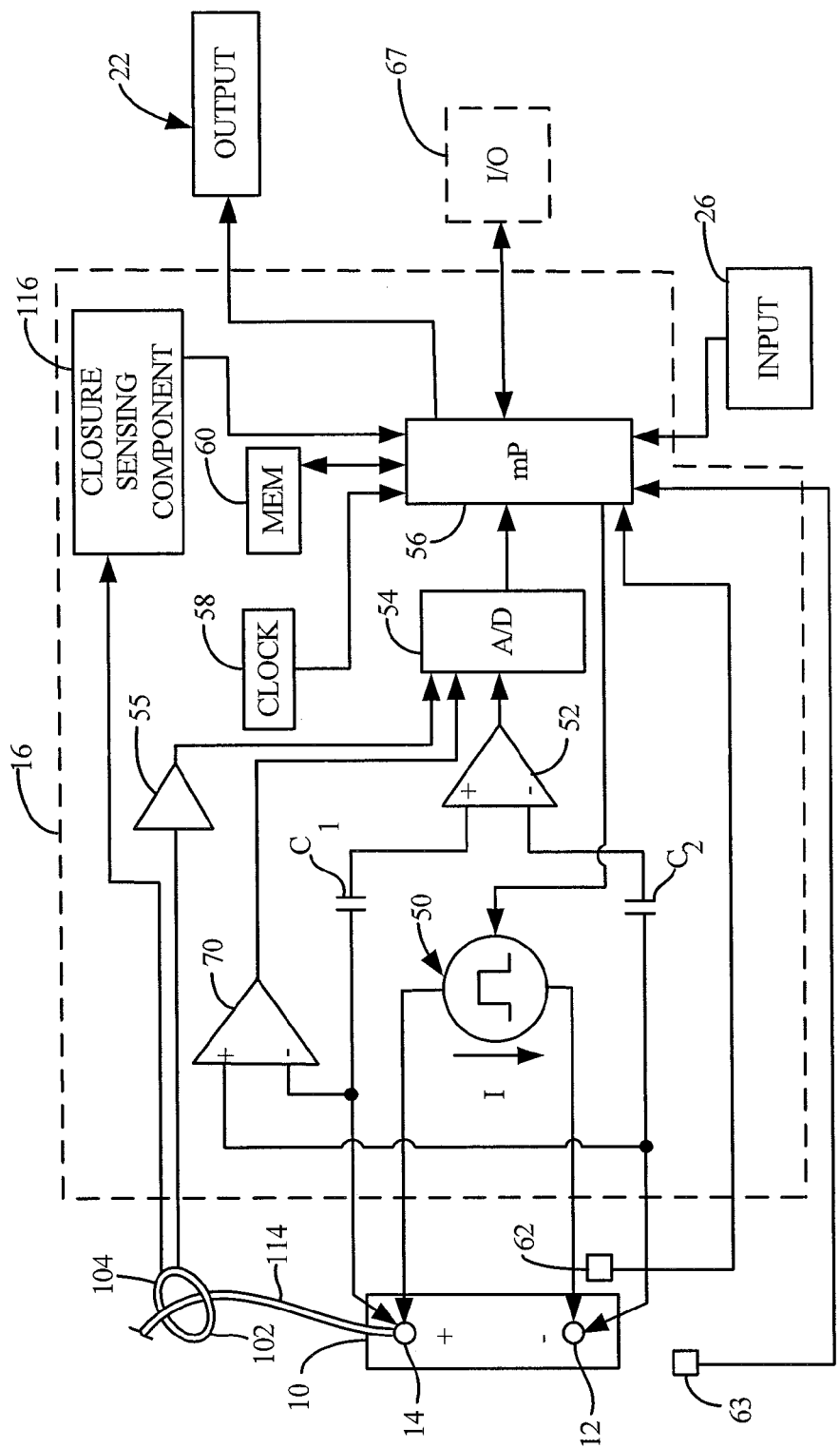
FIG. 1B is a partial schematic diagram and partial block diagram showing a current clamp in a battery tester.

FIG. 1B is a simplified block diagram in which testing device 112 comprises an electronic battery tester (or module) 16 that has current clamp 100 coupled to it, in accordance with one example embodiment. Module 16 is shown coupled to battery 10. Module 16 operates in accordance with one embodiment and determines the conductance ($G_{BAT}$) of battery 10 and the voltage potential ($V_{BAT}$) between terminals 12 and 14, as well as current flowing through conductor 114. Module 16 includes current source 50, differential amplifier 52, analog-to-digital converter 54, amplifier 55 and microprocessor 56.

Amplifier 55 is coupled to current clamp 100 and amplifies (or otherwise conditions) the signals generated therein and provides them to A/D converter 54. A/D converter 54 converts the signal to a digital value and provides it to processor 56. Processor 56 can use the signal in various calculations, or simply to output the current carried by conductor 114 or in other ways. Closure sensing component 116 also provides a signal to processor 56 indicative of whether jaws 102 and 104 are closed. Amplifier 52 is capacitively coupled to battery 10 through capacitors $C_1$ and $C_2$. Amplifier 52 has an output connected to an input of analog-to-digital converter 54. Microprocessor 56 is connected to system clock 58, memory 60, visual output 62 and analog-to-digital converter 54. Microprocessor 56 is also capable of receiving an input from input device 26. Further, an input/output (I/O) port 67 is provided.

In operation, current source 50 is controlled by microprocessor 56 and provides a current in the direction shown by the arrow in FIG. 1. In one embodiment, this is a square wave, sine wave, pulse or other signal with a time varying component or a pulse. Differential amplifier 52 is connected to terminals 22 and 24 of battery 10 through capacitors $C_1$ and $C_2$, respectively, and provides an output related to the voltage potential difference between terminals 12 and 14. In a preferred embodiment, amplifier 52 has a high input impedance. Circuitry 16 includes differential amplifier 70 having inverting and noninverting inputs connected to terminals 24 and 22, respectively. Amplifier 70 is connected to measure the open circuit potential voltage ($V_{BAT}$) of battery 10 between terminals 12 and 14. The output of amplifier 70 is provided to analog-to-digital converter 54 such that the voltage across terminals 12 and 14 can be measured by microprocessor 56.

Module 16 is connected to battery 10 through a four-point connection technique known as a Kelvin connection. This Kelvin connection allows current I to be injected into battery 10 through a first pair of terminals while the voltage V across the terminals 12 and 14 is measured by a second pair of connections. Because very little current flows through amplifier 52, the voltage drop across the inputs to amplifier 52 is substantially identical to the voltage drop across terminals 12 and 14 of battery 12. The output of differential amplifier 52 is converted to a digital format and is provided to microprocessor 56. Microprocessor 56 operates at a frequency determined by system clock 58 and in accordance with programming instructions stored in memory 60. Microprocessor 56 determines the dynamic conductance of battery 10 by applying a current pulse I using current source 50. The microprocessor determines the change in battery voltage due to the current pulse I using amplifier 52 and analog-to-digital converter 54. The value of current I generated by current source 50 is known and is stored in memory 60. In one embodiment, current I is obtained by applying a load to battery 10. Microprocessor 56 calculates the dynamic conductance of battery 10 using the following equation:

$$\text{Conductance} = G_{BAT} = \frac{\Delta I}{\Delta V} \qquad \text{Equation 1}$$

where ΔI is the change in current flowing through battery 10 due to current source 50 and ΔV is the change in battery voltage due to applied current ΔI. A temperature sensor 62 can be thermally coupled to battery 10 and used to compensate battery measurements. Temperature readings can be stored in memory 60 for later retrieval.

In one embodiment module 16 includes a current sensor 63 which measures charge/discharge current of the battery 10. This can be measured by current clamp 100 instead, or in addition. The battery current measurements are utilized by microprocessor 56 to relatively accurately determine state of charge and state of health of battery 10. The current source 50 may comprise an active source or a passive source such as a resistor. In one configuration, source 50 can operate as a large load whereby a load test is applied to the battery 10. In such a load test, the voltage across the battery and/or the current through the battery is monitored (by current clamp 100 or other sensor 63) while a large resistive load is applied.

Figure 2:
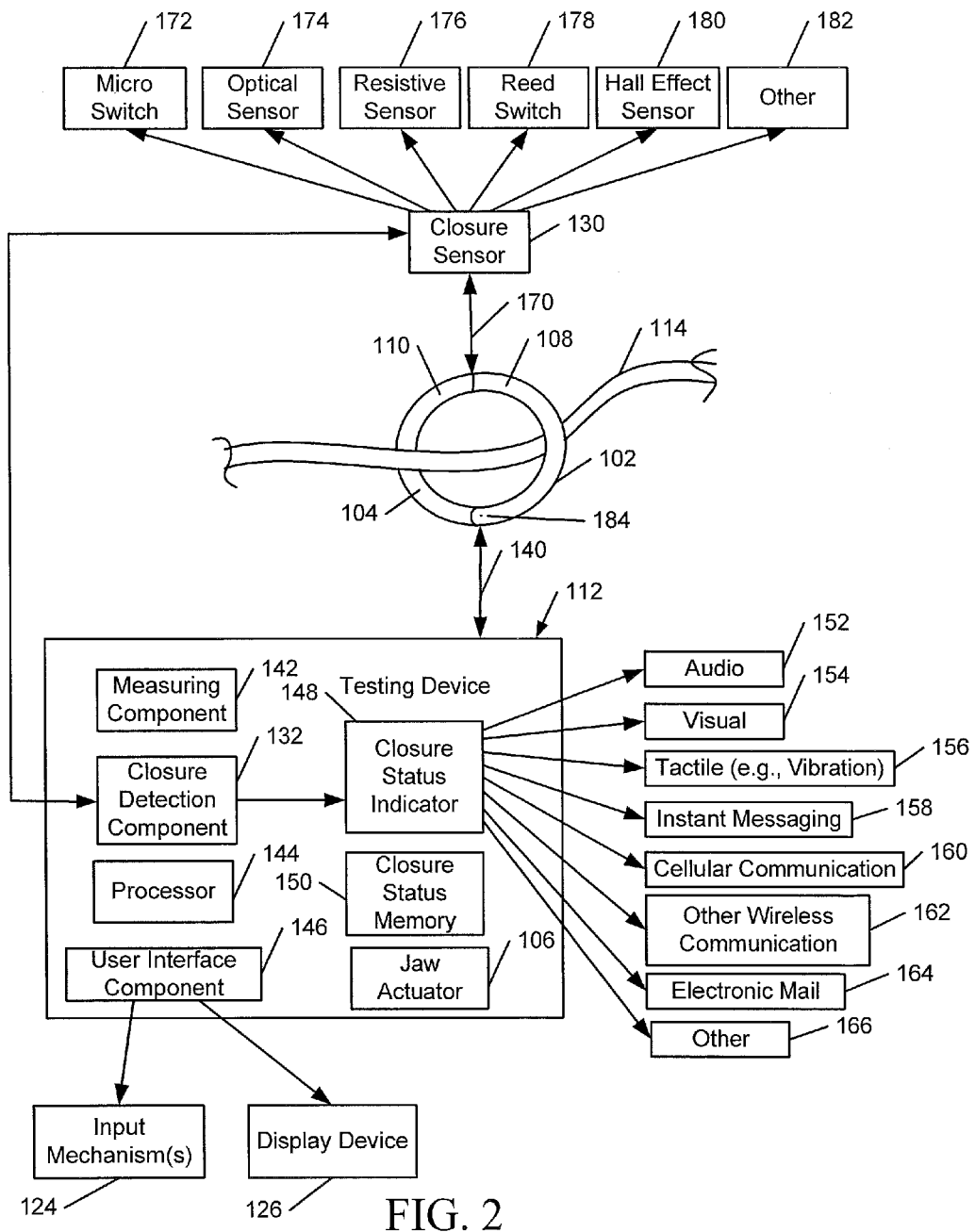
FIG. 2 shows the current clamp of FIG. 1 with the testing device and closure sensors shown in greater detail.

FIG. 2 is a partial block diagram, partial pictorial illustration, of testing device 112 in more detail. FIG. 2 shows that jaws 102 and 104 are not connected to testing device 112. However, in some embodiments, they are connected, as shown in FIGS. 1 and 1A above. They are shown separately and diagrammatically connected by arrow 140, for the sake of example only.

FIG. 2 also shows that, in one embodiment, testing device 112 not only includes closure detection component 132 and jaw actuator 106, but it includes measuring component 142, processor 144, user interface component 146, closure status indicator 148 and closure status memory 150.

Measuring component 142 illustratively includes the electrical circuitry used to measure the parameter of conductor 114. Processor 144 is illustratively a computer processor with associated memory and timing circuitry (not separately shown). Processor 144 is illustratively a functional part of testing device 112 and is activated by other items in testing device 112 to facilitate some of their functionality.

User interface component 146 illustratively receives the input from user input mechanisms 124 (such as the dial shown in FIG. 1A and other user input mechanisms) and provides appropriate signals to other portions of testing device 112. User interface component 146 also illustratively includes the circuitry necessary to generate the displays on display device 126.

Closure status indicator 148 is illustratively used to provide the closure status of jaws 102 and 104, as sensed by sensor 130 and detected by closure detection component 132. Closure detection component 132 illustratively provides a signal to closure status indicator 148 indicative of the closure status of jaws 102 and 104. In the embodiment shown in FIG. 2, closure status indicator illustratively provides some type of output that can be noticed by a user so the user can see whether the jaws 102 and 104 are properly closed.

FIG. 2 shows that the closure status indicator 148 can be one or more of a wide variety of different types of indicators. For instance, closure status indicator 148 can be an audio indicator 152 that provides an audio output for the user to indicate whether the jaws 102 and 104 are open or closed. The indicator can be a visual indicator 154, such as an output on display device 126, the illumination of a light on testing device 112, a textual message displayed on display device 126, or any other type of visual indicator. The closure status indicator can also be a tactile indicator 156. In one embodiment, this is a vibration of testing device 112. Of course, other tactile outputs can be provided as well.

In still other embodiments, closure status indicator 148 is a transmission to a separate device. For instance, it can be an instant message sent to an instant messaging device that is displayed to the user. This is indicated by block 158. It can be a cellular communication that is generated and transmitted to a cellular telephone or smart phone or other cellular device used by the user. This is indicated by block 160. It can also be any other type of wireless communication or even electronic mail (email) sent to a mobile device or other type of computing device used by the user. Wireless communication and email are indicated by blocks 162 and 164 shown in FIG. 2. Of course, the closure status indicator can take other forms as well, and this is indicated by block 166.

FIG. 2 also shows various embodiments of closure sensor 130. FIG. 2 shows that closure sensor 130 is illustratively disposed at a location proximate distal ends 108 and 110 of jaws 102 and 104, respectively. This is indicated diagrammatically by arrow 170. The precise location of closure sensor 130 relative to jaws 102 and 104, however, can vary based upon the particular type of closure sensor 130 that is used. FIG. 2 shows that among the embodiments for closure sensor 130, they can include micro switch 172, optical sensor 174, resistive sensor 176, reed switch 178, Hall Effect sensor 180, or other sensor 182.

Also, it will be appreciated that, while closure sensor 130 is shown in FIG. 2 positioned proximate the distal ends 108 and 110 of the jaws, it could be positioned at other places as well. For instance, if jaws 102 and 104 are positioned to pivot relative to one another about a pivot point 184, then closure sensor 130 can sense the pivoting motion, and position, of jaws 102 and 104 relative to one another proximate the pivot point 184 (that is near the proximal ends of jaws 102 and 104). By way of example only, a potentiometer placed at pivot point 184 can have its wiper connected to one of jaws 102 and 104 such that as the jaws are pivoted relative to one another, the wiper moves thus giving an indication of the position of jaws 102 and 104 relative to one another. However, for the sake of the present description, closure sensor 130 will be described closely proximate the distal ends 108 and 110 of jaws 102 and 104, respectively. This description is given by way of example only.

Figure 3A:
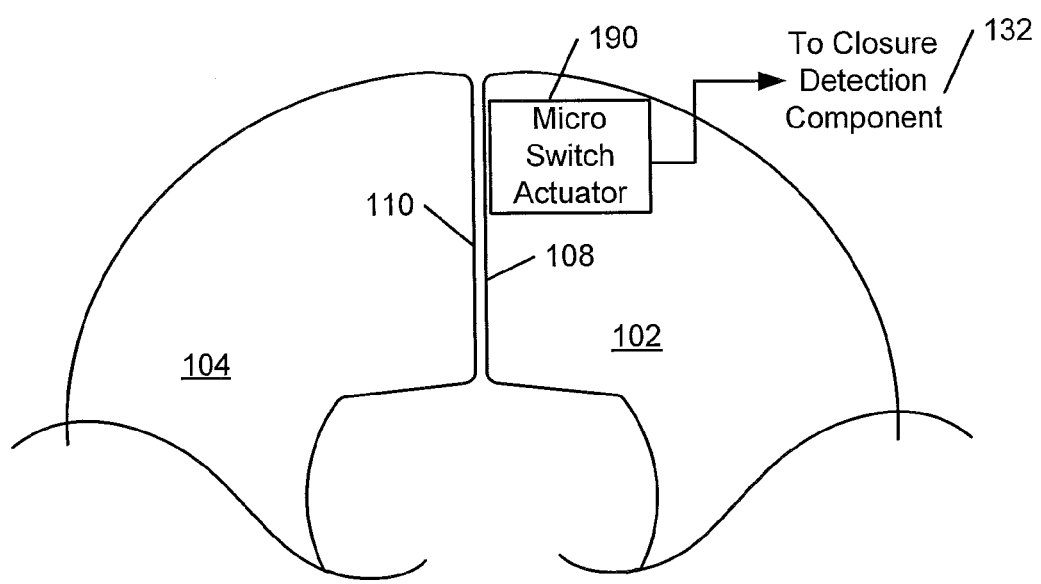
FIGS. 3A-3E show a portion of the current clamp of FIG. 1 with various embodiments of a closure sensor.

FIG. 3A is a partial pictorial and partial block diagram illustration of the distal ends 108 and 110 of jaws 102 and 104, respectively. In the embodiment shown in FIG. 3A, closure sensor 130 is a micro switch (also referred to as a miniature snap-action switch) that is actuated by very little physical force. The force can be directed to a micro switch actuator 190 which is a tipping-point mechanism (e.g., an over-center switch). That is, a relatively small movement of the actuator 190 produces a relatively large movement at a corresponding pair of electrical contacts. For instance, when the micro switch actuator is moved by the distal ends 108 and 110 of jaws 102 and 104 coming into contact with one another, this can operate to open or close a circuit at an associated set of electrical contacts. Closure detection component 132 can thus detect that the circuit has opened or closed, and thus provide an indication as to whether the distal tips 108 and 110 of jaws 102 and 104 are in contact with one another. Other arrangements of micro switch 172 can be used as well.

Figure 3B:
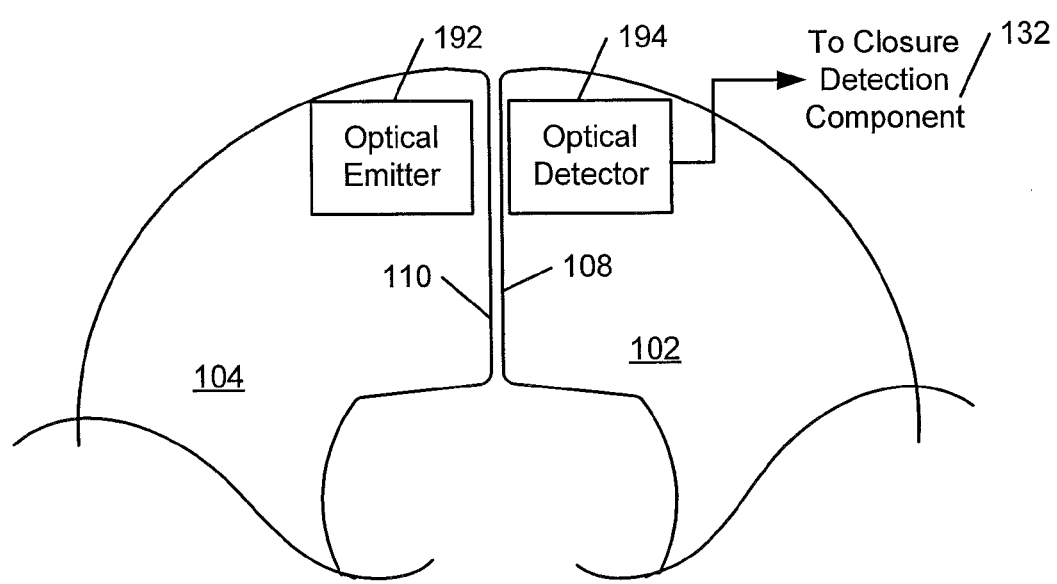

FIG. 3B shows an embodiment in which closure sensor 130 (shown in FIG. 2) is an optical sensor 174 (also shown in FIG. 2). The optical sensor illustratively includes an optical emitter 192 and an optical detector 194. Optical emitter 192 illustratively emits light rays that are sensed by optical detector 194. Optical detector 194 generates a signal indicative of detecting the light emitted by optical emitter 192 and provides it to closure detection component 132. Some optical sensors can measure changes from one or more light beams. The sensed change can be based on a change in the intensity of the light. When a phase change occurs, optical detector 194 can act as a photoelectric trigger, either increasing or decreasing the output signal provided to closure detection component 132. Therefore, when optical emitter 192 is in close enough proximity to optical detector 194, a signal indicative of this can be output to closure detection component 132 thus indicating that jaws 102 and 104 are closed. Other types of optical sensors can be used as well.

Figure 3C:
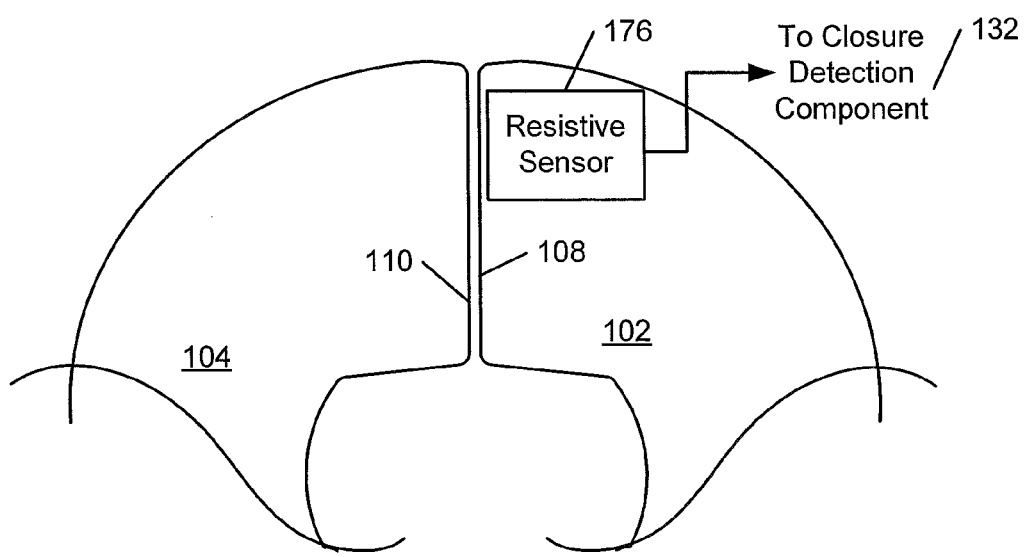

FIG. 3C shows one embodiment in which closure sensor 130 is a resistive sensor 176 (shown in FIG. 2). One type of resistive sensor is a transducer or electromechanical device that converts a mechanical change (such as displacement) into an electrical signal that can be monitored, after appropriate conditioning. One type of resistive sensor is a potentiometer that is an electromechanical device that includes a movable wiper arm. The wiper arm maintains electrical contact with a resistive surface. The wiper is coupled mechanically to a movable member or link (such as one of jaws 102 and 104). There are a wide variety of these types of resistive sensors, and some include carbon film, metal film, wire wound, conductive plastic film, ceramic-metal and slide wire devices. Regardless of which type of resistive sensor 176 is used, it is illustratively situated relative to jaws 102 and 104 to provide a signal indicative of whether the distal ends 108 and 110 of the jaws are in contact with one another. The signal indicative of a position of jaws 102 and 104 is provided to closure detection component 132, which detects whether the jaws are open or closed. Other arrangements of resistive sensors can be used as well.

Figure 3D:
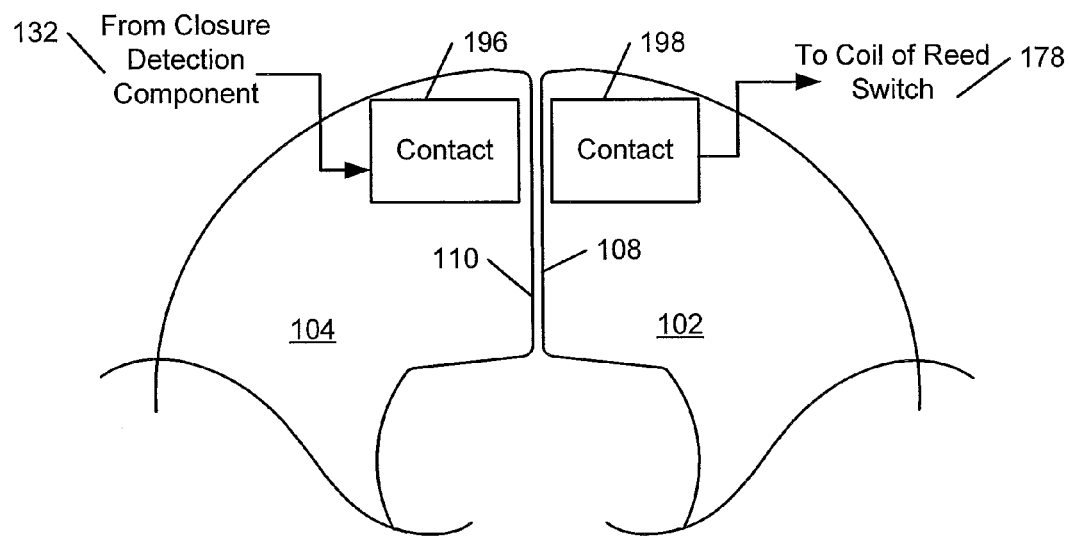

FIG. 3D illustrates one embodiment in which closure sensor 130 is a reed switch or reed relay 178. A reed relay uses an electromagnet to control one or more reed switches. A reed switch has a pair of contacts that connect to either side of a coil. The voltage applied to those contacts (across the coil) applies a magnetic field to the coil and closes a switch that forms a circuit between a separate pair of contacts. Therefore, when the voltage is applied across the first pair of contacts, the circuit across the second pair of contacts closes, and when the voltage across the first pair of contacts is removed, the circuit between the second pair of contacts opens. In the embodiment shown in FIG. 3D, the reed switch is actually located on testing device 112 (such as in closure detection component 132). The voltage applied across the first set of contacts of the reed relay is applied along a conductor that runs from detection component 132 to a first contact 196 on one of jaws 102 and 104 (in this case jaw 104). Contact 196 is paired with a second contact 198 on the other jaw (in this case jaw 102). The conductor runs from contact 198 back to the coil of the reed switch 178. Contacts 196 and 198 are arranged on the distal ends 110 and 108 of jaws 104 and 102 (respectively) such that when the jaws are closed, contacts 196 and 198 are in contact with one another. Therefore, when the jaws are closed, the voltage is applied across the coil of reed switch 178. However, when the jaws 102 and 104 are not closed, then contacts 196 and 198 are not in contact with one another, and the voltage is not applied across the coil of the reed switch. Closure detection component 132 senses whether the reed switch is closed or open. Thus, closure detection component 132 can detect whether contacts 196 and 198 are in contact with one another (and hence whether jaws 102 and 104 are open or closed). Other arrangements of a reed switch can be used as well.

Figure 3E:
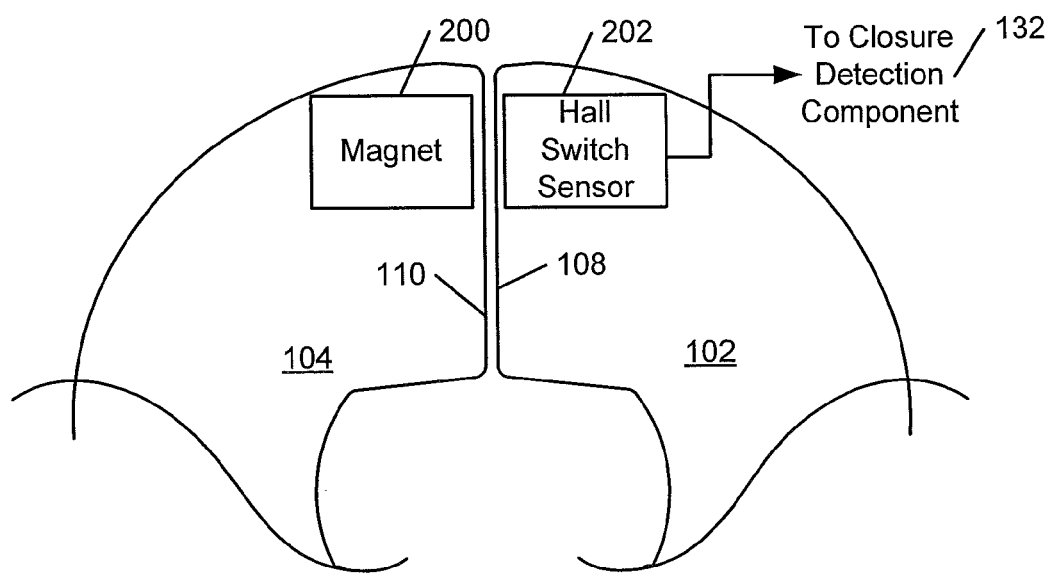

FIG. 3E shows one embodiment in which closure sensor 130 comprises Hall Effect sensor 180. Hall Effect sensor 180 includes magnet 200 and hall switch sensor 202. Hall switch sensor 202 is a transducer that varies its output voltage in response to the magnetic field by magnet 200. In one embodiment, sensor 202 operates as an analog transducer that directly returns a voltage based upon the applied magnetic field. With the known magnetic field generated by magnet 200, the distance between magnet 200 and Hall switch sensor 202 can be determined as well. In one illustrative embodiment, closure detection component 132 includes circuitry that allows Hall switch sensor 202 and magnet 200 to act in a digital on/off mode. Or, when the distal ends 108 and 110 of jaws 102 and 104 are close enough together, Hall switch sensor 202 provides an "on" signal to closure detection component 132. This indicates that jaws 102 and 104 are closed. However, when the distal ends 108 and 110 are separated from one another, hall switch sensor 202 illustratively provides an "off" signal to closure detection component 132, indicating that jaws 102 and 104 are open. Other arrangements of Hall sensors can also be used.

Figure 4:
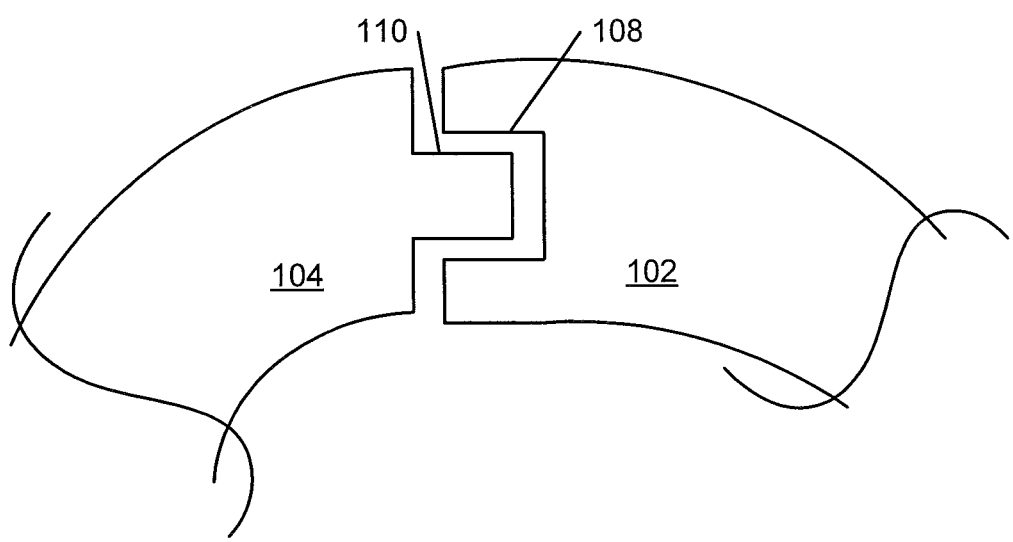
FIG. 4 shows another embodiment of tips of the jaws of the current clamp of FIG. 1.

FIG. 4 shows another embodiment of jaws 102 and 104. In the embodiment shown in FIG. 4, the distal ends 108 and 110 of jaws 102 and 104 have an interlocking, or mating arrangement. While the embodiment shown in FIG. 4 is relatively simple, it will be noted that the distal ends of the jaws can have a more complex arrangement as well. For instance, multiple fingers on one jaw can interlock with multiple fingers on another jaw. Similarly, the jaws can mate coaxially or in other more simple or more complex ways as well. FIG. 4 is simply shown as an example that the closure sensor can be arranged relative to more complex surfaces than those shown in FIG. 3A-3E.

Figure 5:
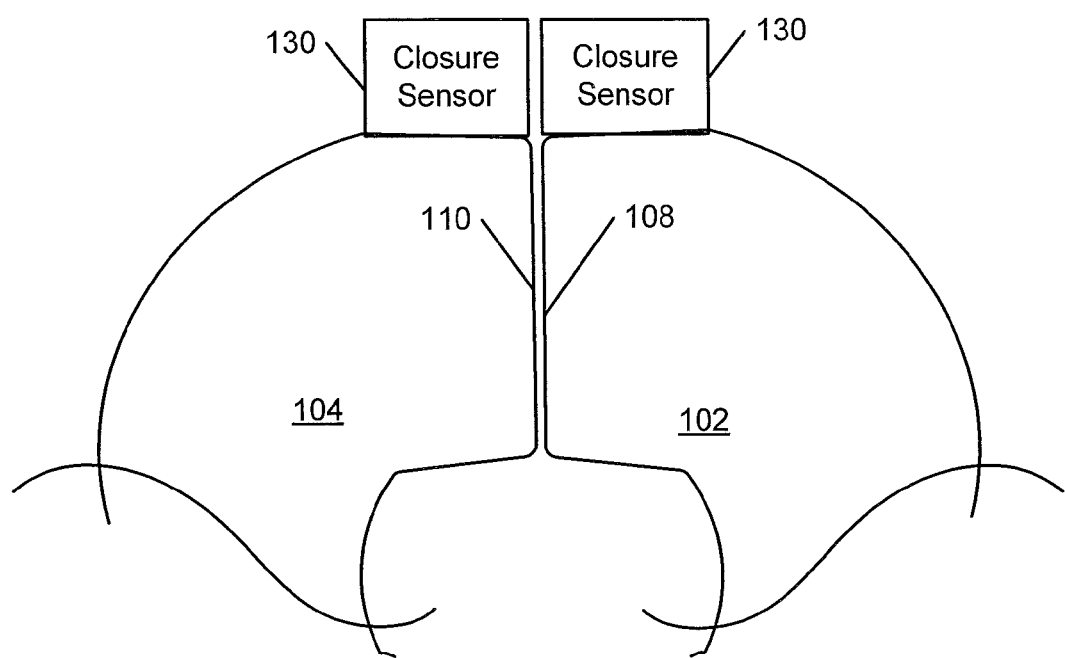
FIG. 5 shows yet another embodiment of the current clamp and closure sensor.

FIG. 5 shows yet another embodiment. In FIG. 5, the closure sensor is located on the external surface of jaws 102 and 104. FIG. 5 is shown because while FIGS. 3A-3E show that the closure sensor is located within jaws 102 and 104, or on a side surface thereof, it is also contemplated that it can be located on an external, distal surface as well. Similarly, of course, the closure sensor 130 can be located substantially anywhere that it can sense whether the distal ends 108 and 110 of jaws 102 and 104 are in contact with one another.

Figure 6:
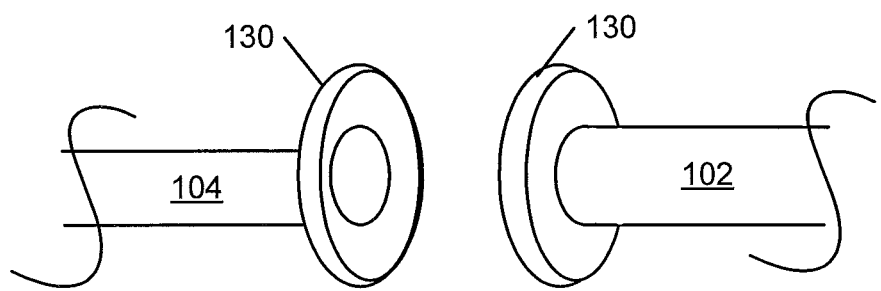
FIG. 6 shows one embodiment of the current clamp with the closure sensor formed by an annular ring.

FIG. 6 shows yet another exemplary embodiment. FIG. 6 illustrates that closure sensor 130 can be disposed about the entire exterior surface of the distal ends of jaws 102 and 104 as well. In the embodiment shown in FIG. 6, closure sensor 130 is disposed as an annular flange on the distal end of one or both of jaws 102 and 104.

The embodiments discussed herein are exemplary only. There are a wide variety of other embodiments which include different types of closure sensors or closure detection circuitry and which include different physical arrangement of the sensors and circuitry relative to jaws 102 and 104. The closure indicator can take a wide variety of different forms as well. Those shown are shown for exemplary purposes only.

It should also be noted that various features of the different embodiments can be combined. That is, one or more features of one embodiment discussed above can be combined with one or more features of other embodiments discussed above. All of these arrangements are contemplated herein.

Although the present invention has been described with reference to preferred embodiments, workers skilled in the art will recognize that changes may be made in form and detail without departing from the spirit and scope of the invention. The clamp of the present invention can be employed with any type of battery maintenance circuitry including battery testers and chargers, as well as vehicle electrical system testers, or other type of test equipment. In one configuration, the closure sensor senses a parameter other than the output of the amp clamp. This allows closure detection even when no current is present in the wire/component being measured.

What is claimed is:

1. An electrical system testing device, comprising:
    a clamp configured to open, receive a conductor, and close around the conductor;
    an actuator that, when actuated, opens the clamp;
    a testing device, operably coupled to the clamp, to measure a current flowing through the conductor for performing maintenance on a battery; and
    a closure sensing component that senses a closure state of the clamp indicative of whether the clamp is closed and provides a closure signal indicative of the closure state of the clamp.

2. The electrical system testing device of claim 1 wherein the clamp comprises:
    a first jaw; and
    a second jaw, the first and second jaws being movable relative to one another to open and close the clamp.

3. The electrical system testing device of claim 2 wherein the first and second jaws each have a distal end, the distal ends of the jaws being in contact with one another when the clamp is closed and being separated from one another when the clamp is open.

4. The electrical system testing device of claim 3 wherein the closure sensing component is disposed to sense whether the distal ends of the jaws are in contact with one another.

5. The electrical system testing device of claim 4 wherein the closure sensing component includes a closure sensor disposed proximate the distal ends of the jaws.

6. The electrical system testing device of claim 3 wherein the jaws each have proximal ends and wherein the jaws are pivotable relative to one another at the proximal ends thereof.

7. The electrical system testing device of claim 6 wherein the closure sensor is disposed at the proximal ends of the jaws.

8. The electrical system testing device of claim 1 wherein the closure sensing component comprises an optical sensor.

9. The electrical system testing device of claim 1 wherein the closure sensing component comprises a resistive sensor.

10. The electrical system testing device of claim 1 wherein the closure sensing component comprises a micro switch.

11. The electrical system testing device of claim 1 wherein the closure sensing component comprises a reed switch.

12. The electrical system testing device of claim 1 wherein the closure sensing component comprises a Hall effect sensor.

13. The electrical system testing device of claim 1 wherein the closure sensing component provides a user-observable closure status indicator indicative of the clamp being open.

14. The electrical system testing device of claim 13 wherein the closure status indicator comprises an audio indicator.

15. The electrical system testing device of claim 13 wherein the status indicator comprises a visual indicator.

16. The electrical system testing device of claim 13 wherein the status indicator comprises a tactile indicator.

17. The clamp-on device of claim 1 wherein the testing device comprises a battery tester that measures current running through the conductor to test a battery.

18. A battery tester with a current clamp, comprising:
    a clamp that defines a clamp opening and that has an opening end that opens to receive a conductor coupled to a battery terminal and closes so the conductor runs through the clamp opening;
    a testing device that measures current running through the conductor; and
    a closure sensing component that senses whether the clamp is open and that provides a user-observable closure status indicator indicative of the clamp being open.

19. The battery tester of claim 18 wherein the clamp has a pair of jaws that have ends that are separated from one another to open the clamp and in contact with one another to close the clamp and wherein the closure sensing component comprises a sensor configured to sense whether the ends of the jaws are in contact with one another.

20. A current clamp, comprising:
    a clamp that defines a clamp opening and that has an opening end that opens to receive a conductor and closes so the conductor runs through the clamp opening, wherein the clamp has a pair of jaws that have ends that are separated from one another to open the clamp and in contact with one another to close the clamp;
    a testing device that measures current running through the conductor; and
    a closure sensing component that senses whether the clamp is open and that provides a user-observable closure status indicator indicative of the clamp being open, the closure sensing component comprising a sensor configured to sense whether the ends of the jaws are in contact with one another.

* * * * *